United States Patent [19]

Nishimoto et al.

[11] 4,224,089
[45] Sep. 23, 1980

[54] PROCESS FOR PRODUCING A SEMICONDUCTOR DEVICE

[75] Inventors: Keiji Nishimoto; Shinpei Tanaka, both of Yokohama, Japan

[73] Assignee: Fujitsu Limited, Kanagawa, Japan

[21] Appl. No.: 971,692

[22] Filed: Dec. 21, 1978

[30] Foreign Application Priority Data

Dec. 29, 1977 [JP] Japan .................. 52-160296

[51] Int. Cl.³ .................................. H01L 21/225
[52] U.S. Cl. ............................ 148/187; 148/188; 29/571
[58] Field of Search .................. 148/187, 186, 188; 29/571

[56] References Cited

U.S. PATENT DOCUMENTS

| | | | |
|---|---|---|---|
| 3,806,371 | 4/1974 | Barone | 148/188 X |
| 3,825,442 | 7/1974 | Moore | 148/1.5 X |
| 3,972,756 | 8/1976 | Nagase et al. | 156/17 |
| 3,986,903 | 10/1976 | Watrous | 148/187 |
| 4,023,195 | 5/1977 | Richman | 148/187 X |
| 4,043,848 | 8/1977 | Bazin | 148/187 |
| 4,079,504 | 3/1978 | Kosa | 148/187 X |
| 4,113,533 | 9/1978 | Okumura et al. | 148/187 |

Primary Examiner—G. Ozaki
Attorney, Agent, or Firm—Staas & Halsey; Staas & Halsey

[57] ABSTRACT

In a process for producing a semiconductor device having a protecting glass film containing an impurity of a first conductivity type, a masking film is formed on the surface of at least a portion of a region of a second conductivity type opposite to the first conductivity type, this region being within a semiconductor substrate. The masking film is not etched by an etching agent for the protecting glass film and prevents the impurity issuing out of the protecting glass film from entering into the region when the surface of the protecting glass film is smoothed by heating it. After the heating treatment the masking film is at least partly removed to make the window for an electrode contact to the region of the second conductivity type.

18 Claims, 9 Drawing Figures

PROCESS FOR PRODUCING A SEMICONDUCTOR DEVICE

BACKGROUND OF THE INVENTION

1. Field of the Invention

The present invention relates to a process for producing a semiconductor device which has a protecting film comprising an impurity-containing glass.

2. Description of the Prior Art

A semiconductor device, for example a metal insulator semiconductor field effect transistor (MIS FET), is frequently provided with an impurity-containing glass film, especially a phosphosilicate glass (PSG) film, for insulating and protecting it. In producing such a semiconductor device, after the formation of the phosphosilicate glass film, the phosphosilicate glass film is heated to cause a controlled plastic flow of this glass film to smooth any sharp surface contour. This prevents a metal electrode or a conductive film from breaking when the electrode or conductive film is formed. Such a controlled plastic flow of a glass is described, for example, in U.S. Pat. No. 3,825,442. However, the heating treatment causes a very inconvenient problem, i.e. a very poor ohmic contact between an electrode and the semiconductor material surface. This inconvenient problem will now be explained referring to the attached FIG. 1 and FIG. 2.

FIG. 1 and FIG. 2 are partial cross-sectional views of a semiconductor device in intermediate stages of production in accordance with prior art techniques. In FIG. 1 and FIG. 2, reference numerals 1, 2, 3, 4 and 5 represent a silicon semiconductor substrate of n-type, a silicon dioxide film, a region having a diffused p-type impurity (a source or drain region), a phosphosilicate glass (PSG) film and a window for an electrode contact, respectively.

After the phosphosilicate glass film 4 is formed, the electrode-contact window 5 is opened in the phosphosilicate glass film 4 and the silicon dioxide film 2 by an ordinary photolithographic method (cf. FIG. 1). Then the phosphosilicate glass film 4 is softened by heating it, whereby the surface of the phosphosilicate glass film 4 becomes smooth and, especially, the edge portion of the glass film 4 defining the window 5 is provided with a gradual slope (cf. FIG. 2).

When such heating treatment is performed, phosphorus contained in the phosphosilicate glass film 4 is diffused out of the glass film 4, and this outdiffused phosphorus enters into the region 3 having the diffused p-type impurity. As a result, a region 6 (FIG. 2) having a diffused n-type impurity (i.e. phosphorus) is formed. Therefore, a PN junction is formed in the region 3, so that a good ohmic contact between a metal electrode and the surface of the region 3 cannot be obtained. Most persons skilled in the art would be of the opinion that prior to the heating treatment the window 5 should be opened in only the phosphosilicate glass film 4 while the silicon dioxide film 2 remains on the region 3. However, at present it is not known how effectively to selectively etch only the phosphosilicate glass film 4, so that the etching inevitably proceeds to the silicon dioxide film 2.

SUMMARY OF THE INVENTION

It is an object of the present invention to provide a process for producing a semiconductor device which has a protecting glass film containing an impurity, and has a good ohmic contact between a predetermined surface portion of a semiconductor material and a metal electrode formed in an electrode-contact window.

It is another object of the present invention to provide a process for producing a semiconductor device, said process including steps for preventing a PN junction from occuring in an impurity-diffused region within a semiconductor substrate when a protecting glass film containing an impurity of a first conductivity type is softened by heating it, said impurity-diffused region being of a second conductivity type opposite to the first conductivity type.

The above mentioned objects are attained with a process for producing a semiconductor device, specifically a metal insulator semiconductor field effect transistor (MIS FET), comprising the steps of: forming an impurity-introduced region within a semiconductor substrate; forming a masking film on a portion of the surface of said impurity-introduced region; forming an impurity-containing glass film on a surface of the semiconductor substrate including the masking film; opening a precursory window in a portion of the impurity-containing glass film by using an etching agent which is not capable or is only slightly capable of etching the masking film; smoothing the surface of the impurity-containing glass film by heating it; removing a portion of the masking film corresponding to the precursory window to provide a completed window for receiving an electrode contact; and forming an electrode connected to the impurity-introduced region surface through the completed window.

The present invention will become more apparent from the description of the preferred embodiment of the invention set forth below with reference to the accompanying drawings.

DETAILED DESCRIPTION OF THE INVENTION

Referring to the FIGS. 3 through 9, a process for producing a semiconductor device, for example, a metal insulator semiconductor (MIS) device, is explained. On a silicon semiconductor substrate of n-type 11, a silicon dioxide film 12 at a field area, an oxide film for a gate insulator 12G and a silicon gate 13G are formed. Such structure is obtained by a well-known silicon gate technology. Within the semiconductor substrate 11 a region having a diffused p-type impurity 14 (i.e. a source or drain region) is formed (cf. FIG. 3). Such structure of the unfinished semiconductor device illustrated in FIG. 3 and various methods for forming it are well known in the art, and hence, will not be discussed in greater detail.

Figure 4:
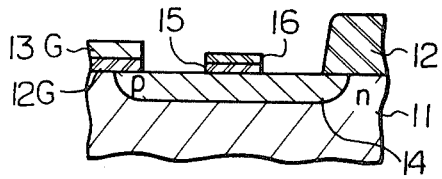
Figure 5:
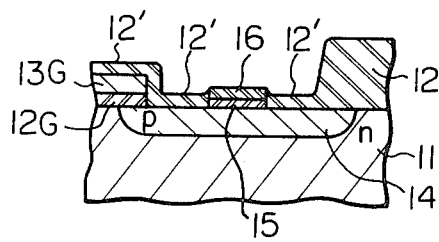
Figure 6:
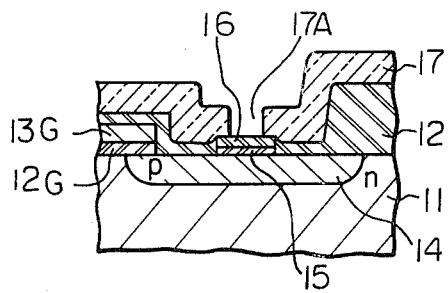

A silicon dioxide ($SiO_2$) film of from 100 to 300 Å, preferably about 200 Å, thickness is formed on the surface of the region 14 by the thermal oxidation method, namely, by the thermal oxidation of a portion of said silicon substrate 11. It should be noted that it is also possible to utilize a sputtering method or an evaporation method instead of the thermal oxidation method. A silicon nitride ($Si_3N_4$) film of from 300 to 700 Å, preferably about 500 A, thickness is formed on the silicon dioxide film by a chemical vapor deposition (CVD) method. It should be noted that it is also possible to utilize a sputtering method instead of the chemical vapor deposition method. Then, the silicon dioxide film and the silicon nitride (i.e. $Si_3N_4$) film are etched utilizing an ordinary photolithographic method to shape a masking film 15 of silicon dioxide and a masking film 16 of silicon nitride as shown in FIG. 4. It should be noted that, instead of the masking film 16 it is possible to use a material film which is not etched or is etched at an essentially lower rate than that of an impurity-containing glass, i.e. a phosphosilicate glass, by an etching agent for the impurity-containing glass. For example, an aluminum oxide ($Al_2O_3$) film might be used for the masking film by selecting an adequate etchant.

A silicon dioxide film 12' of from 500 to 1000 A, preferably about 700 A, thickness is formed by the thermal oxidation method. In this case the silicon dioxide film is naturally not formed on the masking film 16 of silicon nitride (cf. FIG. 5).

As a protecting glass film containing an impurity, the phosphosilicate glass film 17 of from 5,000 to 15,000 A, preferably about 10,000 A, thickness is formed by applying the chemical vapor deposition method. The phosphosilicate glass film 17 is then etched by the photolithographic method, using an aqueous solution of ammonium fluoride and hydrogen fluoride ($NH_4F+HF+H_2O$) as the etching agent, to open a precursory window 17A for an electrode contact therein. The etching agent used should not etch the masking film 16 of silicon nitride so that the masking films 15 and 16 remain (cf. FIG. 6). The phosphosilicate glass can be practically used as the protecting glass containing an impurity. However, arsenosilicate glass (AsSG), borosilicate glass (BSG) or phosphosilicate glass containing germanium (GePSG), might be used for the protecting glass, but they are less preferable than phosphosilicate glass (PSG), because of such properties as the melting points and electric properties of these glass materials.

Figure 7:
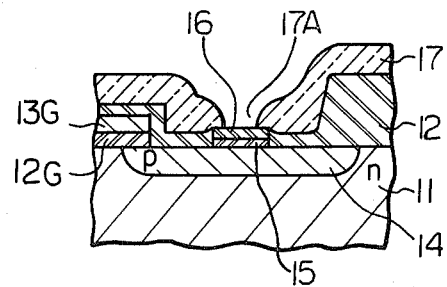
Figure 8:
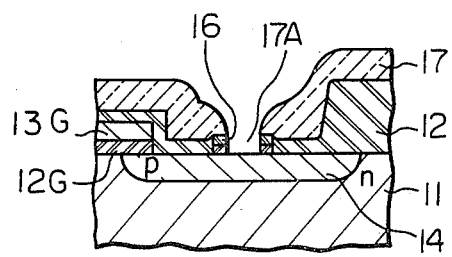

The phosphosilicate glass film 17 is softened by heating at a temperature of from 1,000° to 1,200° C., preferably 1,100° C., whereby the surface thereof becomes smooth and, especially, the edge portion of the glass film 17 defining the precursory window 17A is provided with a gradual slope (cf. FIG. 7). With the heating treatment phosphorus is diffused out of the phosphosilicate glass film 17. However, the masking films 15 and 16 stop the outdiffused phosphorus from entering into the region 14, so that a PN junction can not be formed in the region 14.

The masking film 16 is etched with carbon tetrafluoride ($CF_4$) as an etching agent by a plasma etching method. In the case of $CF_4$, the ratio of the etching rate of the masking film 16 to that of the phosphosilicate glass film 17 is 100 to 1. Accordingly, it is possible to remove the masking film 16 while only a slight part of the phosphosilicate film 17 is etched. Then, the masking film 15 is etched by applying a chemical etching method using an aqueous solution of ammonium fluoride and hydrogen fluoride ($NH_4F+HF+H_2O$). In this case the ratio of the etching rate of the masking film 15 to that of the phosphosilicate glass film 17 is 1 to 5. Accordingly, for example, when a masking film 15 of 200 A thickness is etched, the glass film 17 is etched to widen the window 17A by 1000 A in width. Such enlargement of the width of the window 17A can be ignored, since ordinarily the size of the window 17A is at least 2 μm in width and length. Thus the window 17A for an electrode contact is completed and the portion of the surface of the region 14 corresponding to the completed window 17A is exposed (cf. FIG. 8). It should be noted that it is also possible to utilize a sputter or etching method or an ion etching method instead of the chemical etching method.

Figure 9:
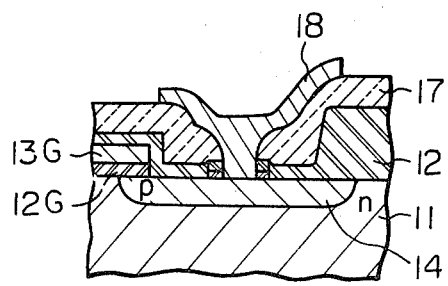

Thereafter, a metal electrode 18 of, e.g. aluminum, is formed in the completed window 17A and a conductive film of, e.g. aluminum, is also formed with a desired pattern by applying an ordinary method, e.g. an evaporation method and a photolithographic method (cf. FIG. 9). Thus, the metal insulator semiconductor (MIS) device having a good ohmic contact is produced, because, in the producing process, the formed masking film prevents formation of an unnecessary PN junction affecting the good ohmic contact.

Although the producing process according to the present invention has been described in connection with FIGS. 3 through 9, in which a metal insulator semiconductor device is illustrated, the process can also be applied for the production of a bi-polar semiconductor device, when an impurity of the first conductivity type diffused out of an impurity-containing glass film enters into a region of the second conductivity type and impedes ohmic contact between this region and a metal electrode.

The present invention is further illustrated by the following example.

EXAMPLE

Figure 1:
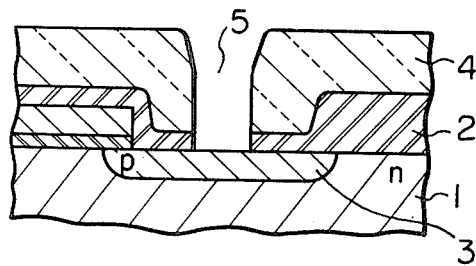
FIGS. 1 and 2 are partial cross-sectional views of a semiconductor device in intermediate stages of production in accordance with prior art techniques.
Figure 2:
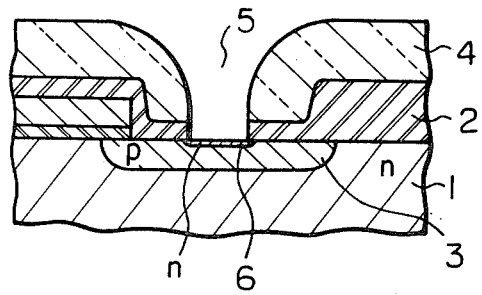
Figure 3:
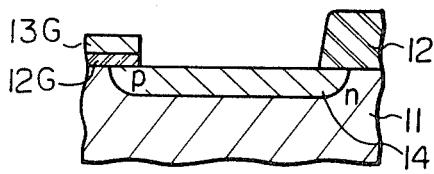
FIGS. 3 through 9 are partial cross-sectional views of a semiconductor device in stages of production in accordance with the present inventions.

A silicon substrate is of n-type, with a resistivity of 10 Ω-cm and an orientation of the <100> direction. A p-type region was formed within the silicon substrate provided with a silicon gate electrode by diffusion of boron as shown in FIG. 3.

Thereafter a first masking film of silicon dioxide, of 200 A thickness, was formed on the p-type region by the thermal oxidation method. The oxidation was carried out at 1,050° C., for 10 minutes, under a dry oxygen atmosphere. On the formed silicon dioxide film a second masking film of silicon nitride, of 500 A thickness, was formed by the chemical vapor deposition method, at 800° C., for 20 minutes. The formed first and second masking films were etched by the photolithographic method, known in the art, to remove the unnecessary portions of these masking films.

A silicon dioxide film of 700 A thickness was formed on the entire surface of the unfinished device, except for the second masking film, by the thermal oxidation method. This oxidation was carried out at 950° C., for 15 minutes, under a wet oxygen atmosphere. Then, a phosphosilicate glass film, containing phosphorus of 8 wt%, of 1 μm thickness, was formed by the chemical vapor deposition method, at 670° C. A precursory window for an electrode contact was opened in only the phosphosilicate glass film by the chemical etching method using an aqueous solution of ammonium fluoride and hydrogen fluoride ($NH_4F+HF+H_2O$). The window was 2 μm in width and length. The phosphosilicate glass film having the precursory window ws softened by heating at 1,100° C., for 10 minutes, whereby the edge portion of the glass film defining the precursory window became a gradual slope. Thereafter, the portion of the second masking film of silicon nitride corresponding to the precursory window was removed by the plasma etching method using carbon tetrafluoride as an etchant. The portion of the first masking film of silicon dioxide corresponding to the precursory window was removed by the chemical etching method using an aqueous solution of ammonium fluoride and hydrogen fluoride (NH$_4$F+HF+H$_2$O). As a result, the electrode-contact window was completed and the portion of the surface of the region corresponding to the completed window was exposed. The size of the window at the level of the second masking film surface was slightly enlarged to 2.2 μm in width and length. Finally a metal electrode of aluminum was formed in the completed window by the evaporation method. The thus produced metal oxide semiconductor (MOS) device had a good ohmic contact between the electrode and the region within the substrate.

As mentioned above, the illustrated process is suited for manufacturing P-channel MOS devices and complementary MOS devices (CMOS). The present invention is also applicable to various other types of semiconductor devices without departing from the scope and spirit of the present invention.

What we claim is:

1. A process for producing a semiconductor device comprising the steps of:
   forming an impurity-introduced region within a semiconductor substrate;
   forming a masking film on a portion of the surface of said impurity-introduced region;
   forming an impurity-containing glass film on a surface of said semiconductor substrate including said masking film;
   opening a precursory window in a portion of said impurity-containing glass film over said masking film;
   smoothing the surface of said impurity-containing glass film by heating it;
   removing a portion of said masking film within said precursory window to provide a completed window for receiving an electrode contact; and
   forming an electrode connected to said impurity-introduced region surface through said completed window.

2. A process according to claim 1, wherein said semiconductor substrate comprises a silicon wafer of a first conductivity type.

3. A process according to claim 2, wherein said first conductivity type is n-type.

4. A process according to claim 1, wherein said substrate is of a first conductivity type and said impurity-introduced region is of a second conductivity type which is opposite to said first conductivity type.

5. A process according to claim 4, wherein said second conductivity type is p-type.

6. A process according to claim 1, wherein said substrate is of a first conductivity type and said impurity contained in said impurity-containing glass film is of the first conductivity type.

7. A process according to claim 6, wherein said impurity-containing glass film is a phosphosilicate glass (PSG) film.

8. A process according to claim 1, wherein said step of opening the precursory window in said impurity-containing glass film is carried out using an aqueous solution of ammonium fluoride and hydrogen fluoride (NH$_4$F+HF+H$_2$O).

9. A process according to claim 1, wherein said masking film is composed of a silicon dioxide film on said substrate and a silicon nitride film on said silicon dioxide film.

10. A process according to claim 9, wherein said silicon dioxide film is formed by thermal oxidation of a portion of said silicon wafer.

11. A process according to claim 9, wherein said silicon dioxide film is chemically etched by using an aqueous solution of ammonium fluoride and hydrogen fluoride.

12. A process according to claim 9, wherein said silicon nitride is formed by a chemical vapor diposition (CVD) method.

13. A process according to claim 9, wherein said silicon nitride is etched by a plasma etching method using carbon tetrafluoride (CF$_4$).

14. A process according to claim 1, wherein said semiconductor device is a metal insulator semiconductor field effect transistor (MIS FET).

15. A process according to claim 1, wherein said semiconductor device is a complementary metal oxide semiconductor (CMOS) field effect transistor.

16. In a process for manufacturing a semiconductor device comprising providing an electrode connection without discontinuities through a window to a portion of the surface of a semiconductor component of said device and the heating of a glass component of said device containing an impurity that is capable of diffusing out of said glass component and into said portion of said surface during said heating, the improvement comprising:
   providing a masking layer at said portion of said durface before said heating of said glass;
   removing a portion of said masking layer corresponding to said window after said heating of said glass to complete said window to said portion of said surface of said semiconductor component; and
   providing said electrode connection in said window; whereby said out-diffusing impurity is kept from entering said portion of said surface of said semiconductor component during said heating.

17. The improved process of claim 16, comprising forming said masking layer to prevent contact of said glass component with said portion of said surface of said semiconductor portion of said device before said heating, and
   forming a portion of said window through said glass component down to said masking layer prior to said heating.

18. The improved process of claim 17 comprising forming said glass component to be in contact with and to cover at least a portion of said masking layer.

* * * * *

UNITED STATES PATENT AND TRADEMARK OFFICE
CERTIFICATE OF CORRECTION

PATENT NO. : 4,224,089

DATED : September 23, 1980

INVENTOR(S) : Nishimoto et al.

It is certified that error appears in the above—identified patent and that said Letters Patent is hereby corrected as shown below:

```
Front page, under "Attorney, Agent or Firm", delete
           "; Staas & Halsey".
Column 2, line 43, "inventions" should be --invention--;
          lines 61, 62, 68, "A" should be --Å--.
Column 3, lines 1, 17, 18, 23, 24, 65, "A" should be --Å--;
          lines 43, 44, "C.," should be --C,-°;
          line 67, "1000 A" should be --1000 Å--.
Column 4, line 37, after "boron" insert --,--;
          lines 41, 45, 52, 63, "C.," should be --C,--;
          lines 39, 43, "A" should be --Å--;
          line 49, "700 A" should be --700 Å--;
          line 62, "ws" should be --was--.
Column 6, line 21, "diposition" should be --deposition--;
          line 42, "durface" should be --surface--.
```

Signed and Sealed this

Tenth Day of March 1981

[SEAL]

Attest:

RENE D. TEGTMEYER

*Attesting Officer*     *Acting Commissioner of Patents and Trademark*